(12) United States Patent
Kendall et al.

(10) Patent No.: US 12,387,104 B2
(45) Date of Patent: Aug. 12, 2025

(54) DEEP LEARNING IN BIPARTITE MEMRISTIVE NETWORKS

(71) Applicant: University of Florida Research Foundation, Inc., Gainesville, FL (US)

(72) Inventors: Jack D. Kendall, Gainesville, FL (US); Juan C. Nino, Gainesville, FL (US); Laura E. Suarez, Bogota (CO)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 18/138,984

(22) Filed: Apr. 25, 2023

(65) Prior Publication Data

US 2023/0297839 A1 Sep. 21, 2023

Related U.S. Application Data

(63) Continuation of application No. 15/985,212, filed on May 21, 2018, now abandoned.

(Continued)

(51) Int. Cl.
*G06N 3/08* (2023.01)
*G06N 3/049* (2023.01)
(Continued)

(52) U.S. Cl.
CPC ............ *G06N 3/084* (2013.01); *G06N 3/049* (2013.01); *G06N 3/065* (2023.01); *G06N 5/046* (2013.01)

(58) Field of Classification Search
CPC ........ G06N 3/084; G06N 3/049; G06N 3/065; G06N 5/046; G11C 2013/0073; G11C 13/0069
See application file for complete search history.

(56) References Cited

U.S. PATENT DOCUMENTS 8,930,291 B1 1/2015 Srinivasa et al.
9,418,331 B2 8/2016 Gupta et al.
(Continued)

FOREIGN PATENT DOCUMENTS

CN 104779950 A 7/2015
CN 105160401 A 12/2015
(Continued)

OTHER PUBLICATIONS

Nguyen et al., Electrospun nanofibers with a core-shell structure of silicon nanoparticles and carbon nanotubes in carbon for use as lithium-ion battery anodes, Jul. 2014, 8 pages (Year: 2014).*

(Continued)

*Primary Examiner* — Omar F Fernandez Rivas
*Assistant Examiner* — Tri T Nguyen
(74) *Attorney, Agent, or Firm* — Thomas | Horstemeyer, LLP

(57) ABSTRACT

A bipartite memristive network and method of teaching such a network is described herein. In one example case, the memristive network can include a number of nanofibers, wherein each nanofiber comprises a metallic core and a memristive shell. The memristive network can also include a number of electrodes deposited upon the nanofibers. A first set of the number of electrodes can include input electrodes in the memristive network, and a second set of the number of electrodes can include output electrodes in the memristive network. The memristive network can be embodied as a bipartite memristive network and trained according to the method of teaching described herein.

20 Claims, 7 Drawing Sheets

Related U.S. Application Data

(60) Provisional application No. 62/509,423, filed on May 22, 2017.

(51) Int. Cl.
  *G06N 3/065* (2023.01)
  *G06N 3/084* (2023.01)
  *G06N 5/046* (2023.01)

(56) References Cited

U.S. PATENT DOCUMENTS

| | | | |
|---|---|---|---|
| 9,646,243 | B1 | 5/2017 | Gokmen |
| 9,691,479 | B1* | 6/2017 | Merced Grafals ... G11C 13/004 |
| 9,847,132 | B1* | 12/2017 | Zheng ............... G11C 13/0069 |
| 2004/0091264 | A1* | 5/2004 | Beshai .............. H04Q 11/0005 398/47 |
| 2004/0153426 | A1 | 8/2004 | Nugent |
| 2007/0291524 | A1* | 12/2007 | Davis .................... B82Y 10/00 365/49.17 |
| 2010/0081958 | A1 | 4/2010 | She |
| 2011/0096589 | A1 | 4/2011 | Bratkovski et al. |
| 2012/0011088 | A1 | 1/2012 | Aparin et al. |
| 2012/0011090 | A1 | 1/2012 | Tang et al. |
| 2012/0011093 | A1 | 1/2012 | Aparin et al. |
| 2012/0194967 | A1 | 8/2012 | Keane et al. |
| 2014/0151623 | A1 | 6/2014 | Jeon et al. |
| 2014/0156574 | A1 | 6/2014 | Piekniewski et al. |
| 2014/0156576 | A1 | 6/2014 | Nugent |
| 2015/0106316 | A1 | 4/2015 | Birdwell et al. |
| 2015/0269483 | A1* | 9/2015 | Nishitani ............... G06N 3/065 706/25 |
| 2016/0004960 | A1 | 1/2016 | Saïghi et al. |
| 2016/0275395 | A1 | 9/2016 | Amir et al. |
| 2017/0011290 | A1* | 1/2017 | Taha ..................... G06N 3/065 |
| 2017/0017877 | A1* | 1/2017 | Kataeva ................... G06N 3/08 |
| 2017/0017879 | A1 | 1/2017 | Kataeva et al. |
| 2017/0098156 | A1 | 4/2017 | Nino et al. |

FOREIGN PATENT DOCUMENTS

| | | |
|---|---|---|
| JP | H07282168 | 10/1995 |
| JP | H09185596 | 7/1997 |
| JP | 2013534676 | 9/2013 |
| KR | 1020170019414 | 2/2017 |

OTHER PUBLICATIONS

CN Office Action for CN 2018800311967 mailed Jan. 19, 2023.
PCT Patent Application PCT/US2018/033669 filed on May 21, 2018, International Search Report and Written Opinion mailed on Aug. 6, 2018.
PCT Patent Application PCT/US2017/058757 filed on Oct. 27, 2017, International Search Report and Written Opinion mailed on Jan. 18, 2018.
PCT Patent Application PCT/US2017/058816 filed on Oct. 27, 2017, International Search Report and Written Opinion mailed on Jan. 26, 2018.
European Patent Application EP15810294.7 filed on Jun. 5, 2015, Supplementary European Search Report mailed on Jan. 26, 2018.
Deng et al., Deep convex net: A scalable architecture for speech pattern classification. Proceedings of the Annual Conference of the International Speech Communication Association, Interspeech, 2285-2288 (Aug. 2011).
Grishin et al., Nb2O5 nanofiber memristor, Applied Physics Letters, 103(5), 053111 (Jul. 2013).
Hasler et al., Finding a roadmap to achieve large neuromorphic hardware systems, Frontiers in Neuroscience, 7, 118 (Sep. 2013).
Hutchinson et al., Tensor deep stacking networks. IEEE Transactions on Pattern Analysis and Machine Intelligence, 35(8), 1944-1957 (Aug. 2013).
Izhikevich et al., Large-scale model of mammalian thalamocortical systems. Proceedings of the National Academy of Sciences of the United States of America, 105(9), 3593-8 (Mar. 2008).
Jo et al., Nanoscale memristor device as synapse in neuromorphic systems, Nano Letters, 10(4), 1297-1301 (Mar. 2010).
Li et al., Fabrication of Titania Nanofibers by Electrospinning. Nano Letters, 3(4), 555-560 (Apr. 2003).
Manan Suri et al.; "Bio-Inspired Stochastic Computing Using Binary CBRAM Synapses"; IEEE Transactions on Electron Devices; vol. 60. No. 7; Jun. 4, 2013; pp. 2402-2409.
Merolla et al., A digital neurosynaptic core using embedded crossbar memory with 45pJ per spike in 45nm. Custom Integrated Circuits Conference (CICC), 2011 IEEE. IEEE, (Sep. 2011).
Moghe et al., Co-axial Electrospinning for Nanofiber Structures: Preparation and Applications, Polymer Reviews, Polymer Reviews 48.2, 353-377 (May 2008).
Naderi, M. A., Analysis and classification of EEG signals using spectral analysis and recurrent neural networks, Biomedical Engineering (ICBME), 2010 17th Iranian Conference of. IEEE, (Nov. 2010).
Strukov et al., The missing memristor found, Nature, 453(7191), 80-3, (May 2008).
Waser et al., Redox-Based Resistive Switching Memories—Nanoionic Mechanisms, Prospects, and Challenges, Advanced Materials, 21(25-26), 2632-2663 (Jul. 2009).
Williams, R. S. (n.d.), How We Found the Missing Memristor, Spectrum, IEEE, 45(12), 28-35 (Dec. 2008).
Zhi et al., Highly conductive electrospun carbon nanofiber/MnO2 coaxial nano-cables for high energy and power density supercapacitors, Journal of Power Sources, 208, 345-353 (Jun. 2012).
Zidan et al., Single-Readout High-Density Memristor Crossbar, Scientific reports 6, 2-10 (Jan. 2016).
Astaras, A. "Pulse-Stream Binary Stochastic Hardware for Neural Computation: The Helmoltz Machine." A Thesis Submitted for the Degree of Doctor of Philosophy, The University of Edinburgh. (pp. 1-40, 150-176), Sep. 13, 2004. [online] [retrieved on Dec. 27, 2017 (Dec. 27, 2017)] Retrieved from the Internet: URL: https://www.era.lib.ed.ac.uk/handle/1842/11620, entire document, especially Abstract; Figure 4, 5; pp. 23-33, 154-155, 172.
Ben et al., Neurogrid : A Mixed-Analog-Digital Multichip System for Large-Scale Neural Simulations. Proceedings of the IEEE 102.5, 699-716 May 2014).
Kee et al. "Feed-Forward versus Feedback Inhibition in a Basic Olfactory Circuit" In: PLoS Comput Biol 11(10):, Oct. 15, 2015 [online] [retrieved on Dec. 27, 2017 (Dec. 27, 2017)] Retrieved from the Internet: URL: http://journals.plos.org/ploscompbiol/article?id=10.1371/journal.pcbi.1004531, entire document.
Pantazi et al. "All-Memristive Neuromorphic Computing With Level-Tuned Neurons" In: Nanotechnology 27 (2016), Jul. 26, 2016.[online] [retrieved on Dec. 27, 2017 (Dec. 27, 2017)] Retrieved from the Internet: URL: http://iopscience.iop.org/article/10.1088/0957-4484/27/35/355205/meta, entire document.
Burger et al., Hierarchical composition of memristive networks for real-time computing. Nanoscale Architectures (NANOARCH), 2015 IEEE/ACM International Symposium on. IEEE, (Jul. 2015).
Chan et al., Spike timing dependent plasticity with memristive synapse in neuromorphic systems, The 2012 International Joint Conference on Neural Networks (IJCNN), 1-6 (Jun. 2012).
A. Carnell, "An analysis of the use of Hebbian and Anti-Hebbian spike time dependent plasticity learning functions within the context of recurrent spiking neural networks," Neurocomputing, vol. 72, No. 4-6, pp. 685-692, Jan. 2009.
A. E. J. Senador, M. T. Shaw, and P. T. Mather, "Electrospinning of Polymeric Nanofibers: Analysis of Jet Formation," Mat. Res. Soc. Symp. Proc., 2001, vol. 661.
A. Joubert, B. Belhadj, O. Temam, and M. Campus, "Hardware spiking neurons design?: analog or digital??" (2012).
K. Szot, M. Rogala, W. Speier, Z. Klusek, a Besmehn, and R. Waser, "TiO2—a prototypical memristive material.," Nanotechnology, vol. 22, No. 25, p. 254001, Jun. 2011.
C. Zamarreño-Ramos, L. A. Camuñas-Mesa, J. A. Pérez-Carrasco, T. Masquelier, T. Serrano-Gotarredona, and B. Linares-Barranco,

(56) References Cited

OTHER PUBLICATIONS

"On spike-timing-dependent-plasticity, memristive devices, and building a self-learning visual cortex.," Front. Neurosci., vol. 5, No. March, p. 26, Jan. 2011.

Chronakis, I. S. (2005). Novel nanocomposites and nanoceramics based on polymer nanofibers using electrospinning process—A review. Journal of Materials Processing Technology, 167(2-3), 283-293. doi:10.1016/j.matprotec.2005.06.053.

J. Matser, "Structured Liquids in Liquid State Machines," Utrecht University, 2010.

J. Sundaramurthy, V. Aravindan, P. S. Kumar, S. Madhavi, and S. Ramakrishna, "Electrospun TiO 2-d Nanofibers as Insertion Anode for Li-Ion Battery Applications," J. Phys. Chem. C, 2014.

Tran, T. "Simulations of Artificial Neural Network With Memristive Devices"; Boise State University; Publication [online]. Dec. 2012 [retrieved Jul. 14, 2018].

W. Maass, T. Natschläger, and H. Markram, "Real-time computing without stable states: a new framework for neural computation based on perturbations.," Neural Comput., vol. 14, No. 11, pp. 2531-2560, Nov. 2002.

Yang, J. J., Pickett, M. D., Li, X., Ohlberg, D. A., Stewart, D. R., & Williams, R. S. (2008). Memristive switching mechanism for metal/oxide/metal nanodevices. Nature Nanotechnology, 3(7), 429-433. doi:10.1038/nnano.2008.160.

Z. Biolek, D. Biolek and V. Biolková, "SPICE Model of Memristor with Nonlinear Dopant Drift," Radioengineering, vol. 18 (2) pp. 210-214.

Buzsaki, G. (2006). Rhythms of the Brain. Oxford University Press.

Japanese Patent Application JP2016-573557 filed on Jun. 5, 2015, Office Action mailed on Sep. 11, 2018.

Nicole Casal Moore, College of Engineering, image processing 1,000 times faster is goal of new $5M contact, U-M Press Release, USA, University of Michigan, Aug. 14, 2013. URL, http://www.eecs.umich.edu/eecs/about/articles/2013/Lu-image-processing-1000-times-faster.html.

European Search Report and Written Opinion for European U.S. Appl. No. 18/805,503 mailed Mar. 10, 2021.

European Examination Report for Application No. 2018273847 mailed Mar. 4, 2022.

Alibart, et al., "Pattern classification by memristive crossbar circuits using ex situ and in situ training", Nature Communications, Jun. 25, 2013.

Korean Office Action for Korean Patent Application No. 10-2019-7037028 mailed Dec. 29, 2022.

\* cited by examiner

DEEP LEARNING IN BIPARTITE MEMRISTIVE NETWORKS

CROSS-REFERENCE TO RELATED APPLICATIONS

This application is a continuation claiming priority to, and the benefit of, U.S. Ser. No. 15/985,212, filed May 21, 2018, which claims the benefit of U.S. Provisional Application No. 62/509,423, filed May 22, 2017, the entire contents of both are hereby incorporated herein by reference. This application is also related to U.S. Non-Provisional patent application Ser. No. 15/383,527, titled "MEMRISTIVE NANOFIBER NEURAL NETWORKS," the entire contents of which is hereby incorporated herein by reference.

BACKGROUND

A memristor is a passive non-linear two-terminal electrical component. In a memristor, the electrical resistance of the device depends on a history of current that previously flowed through it (or voltage applied across it). Thus, the resistance of a memristor can be changed incrementally by placing a voltage differential or drop across it. When this voltage drop is removed, the memristor retains its current value of resistance. If the polarity of the voltage drop is reversed, the resistance will change in the opposite direction.

In certain circuit configurations, a memristor can act as an artificial synapse with a weight equivalent to its conductance. The strength of the weight can be modified over time by controlling the voltage drop across the memristor. Memristors typically have a threshold voltage drop, below which no change in conductance will occur.

The use of memristors for synaptic networks has been proposed as a promising approach in the field of neuromorphic circuit development. Memristors have been incorporated into crossbar synapse networks with complementary metal oxide semiconductor (CMOS)-based circuitry for presynaptic and postsynaptic voltage control. Those circuits demonstrate that CMOS-based voltage and current control can be used to generate changes in the resistance or impedance (e.g., memory) of memristors.

In a memristive neural network, inputs can be presented as voltages to a set of electrodes in a network of memristors. At a separate set of electrodes in the network, voltages or currents are read out. These are taken to be the outputs of the neural network. The goal of learning in such a memristive neural network is to change the conductances of the memristors in order to minimize some cost or error function.

SUMMARY

One example embodiment includes a method to train a memristive network having a number of input nodes and a number of output nodes. The memristive network can include a bipartite memristive network, and the method can reproduce a backpropagation algorithm for training the memristive network.

In one example, the method includes applying an input voltage or current to an input node among the number of input nodes, grounding an output node among the number of output nodes, measuring an output current or voltage at the output node, comparing the output current or voltage to a target current or voltage to determine an error delta, and applying a threshold voltage or current to the output node for a time period proportional to a magnitude of the error delta.

When the error delta is negative, the method can also include applying a positive threshold voltage or current to the output node for the time period proportional to the error delta, and applying a negative threshold voltage or current to the output node for the time period proportional to the error delta. When the error delta is positive, the method can include reversing a polarity of the input voltage or current applied to the input node, applying a positive threshold voltage or current to the output node for the time period proportional to the error delta, and applying a negative threshold voltage or current to the output node for the time period proportional to the error delta.

In other aspects, the method can further include transforming the error delta into an error delta voltage or current, applying the error delta voltage or current to the output node, and applying the threshold voltage or current to the input node for a second time period proportional to an absolute value of the error delta voltage or current.

When the input voltage or current applied to the input node was positive, the method can include applying a positive threshold voltage or current to the input node for the second time period proportional to the absolute value of the error delta voltage or current, and applying a negative threshold voltage or current to the input node for the second time period proportional to the absolute value of the error delta voltage or current. When the input voltage or current applied to the input node was negative, the method can further include reversing a polarity of the error delta voltage or current applied to the output node, applying a positive threshold voltage or current to the input node for the second time period proportional to the absolute value of the error delta voltage or current, and applying a negative threshold voltage or current to the input node for the second time period proportional to the absolute value of the error delta voltage.

In another embodiment, a memristive network includes a number of nanofibers, wherein each nanofiber comprises a metallic core and a memristive shell, a number of electrodes deposited upon the nanofibers, wherein the number of electrodes comprise a number of input nodes and a number of output nodes, and a training processor.

The training processor can be configured to apply an input voltage or current to an input node among the number of input nodes, ground an output node among the number of output nodes, measure an output current or voltage at the output node, compare the output current or voltage to a target current or voltage to determine an error delta, and apply a threshold voltage or current to the output node for a time period proportional to a magnitude of the error delta.

BRIEF DESCRIPTION OF THE DRAWINGS

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

As noted above, a memristor can act as an artificial synapse with a weight equivalent to its conductance. The strength of the weight can be modified over time by controlling the voltage drop across the memristor. Memristors typically have a threshold voltage drop, below which no change in conductance will occur.

In a memristive neural network, inputs can be presented as voltages to a set of electrodes in a network of memristors. At a separate set of electrodes in the network, voltages or currents are read out. These are taken to be the outputs of the neural network. The goal of learning in such a memristive neural network is to change the conductances of the memristors in order to minimize some cost or error function.

The concepts described herein are directed to a bipartite memristive network and method of teaching such a network. In one example case, the memristive network can include a number of nanofibers, wherein each nanofiber comprises a conductive or metallic core and a memristive shell. The memristive network can also include a number of electrodes deposited upon the nanofibers. A first set of the number of electrodes can include input electrodes in the memristive network, and a second set of the number of electrodes can include output electrodes in the memristive network. The memristive network can be embodied as a bipartite memristive network and trained according to the method of teaching described herein. The concepts described herein are applicable to other forms and structures of bipartite memristive networks (e.g., other than using nanofibers). Further, while the figures illustrate a number of example networks, electrodes, etc., the concepts described herein can be applied to other forms, structures, and sizes of bipartite memristive networks.

Figure 1A:
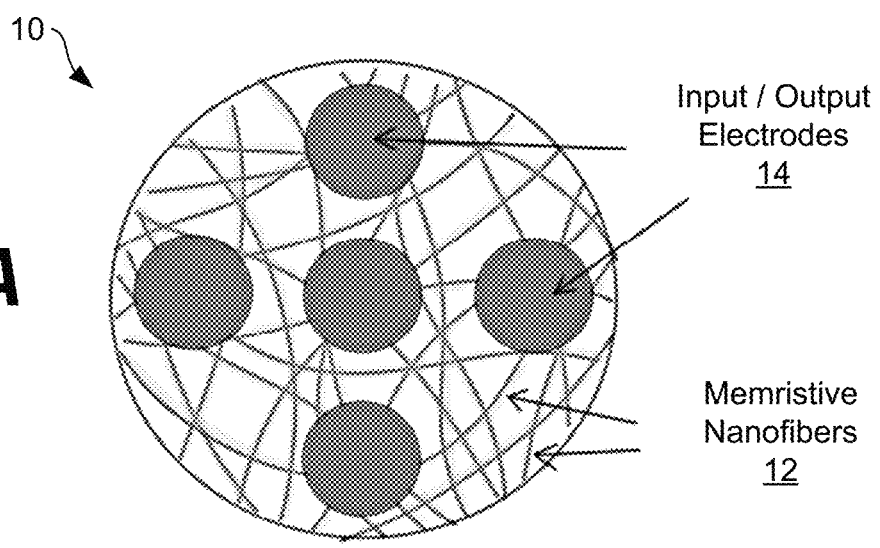
FIG. 1A illustrates an example network architecture of a memristive nanofiber neural network according to various embodiments described herein.

FIG. 1A illustrates an example network architecture of a memristive nanofiber neural network 10 according to various embodiments described herein. As described in further detail below, the neural network 10 takes the form of a bipartite memristive network. In the neural network 10, a number of memristive nanofibers 12 ("nanofibers 12" or "nanofiber 12") are randomly aligned on a substrate, and a set of input/output electrodes 14 are deposited on top of the nanofibers 12.

Figure 1B:
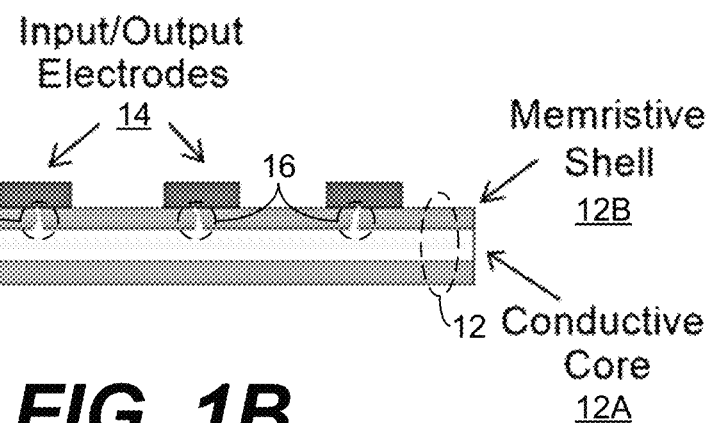
FIG. 1B illustrates example connections between input and output electrodes and memristive nanofibers in the neural network shown in FIG. 1A according to various embodiments described herein.

FIG. 1B illustrates example connections between the input/output electrodes 14 and the memristive nanofibers 12 in the neural network 10 shown in FIG. 1A. As shown in FIG. 1B, each of the nanofibers 12 includes a conductive or metallic core 12A and a memristive shell 12B. Further, at each junction between an electrode 14 and a nanofiber 12, a memristive synapse 16 is formed.

The neural network 10 can be formed in any suitable manner, such as the method described in U.S. Non-Provisional patent application Ser. No. 15/383,527, titled "MEMRISTIVE NANOFIBER NEURAL NETWORKS," the entire contents of which is hereby incorporated herein by reference. For example, the conductive core 12A of the nanofibers 12 can be formed from doped titanium dioxide ($TiO_2$), using a precursor of titanium isopropoxide, titanium butoxide, or another suitable precursor. The memristive shell 12B can be formed around the conductive metallic core 12A by electrospinning the outer shell of the conductive core 12A with a memristive material.

Figure 1C:
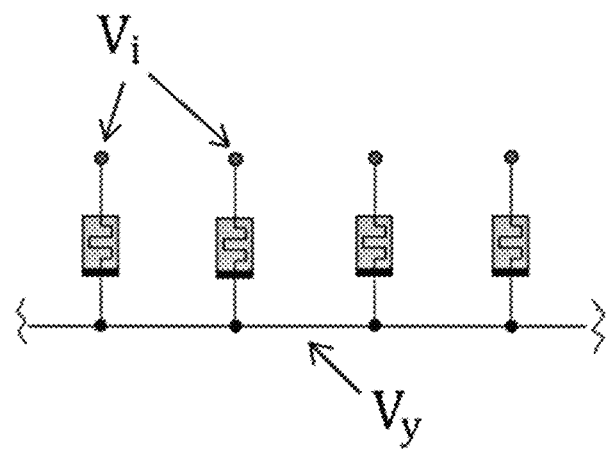
FIG. 1C illustrates an example equivalent circuit of a portion of the neural network shown in FIG. 1A according to various embodiments described herein.

FIG. 1C illustrates an example equivalent circuit of a portion of the neural network 10 shown in FIG. 1A. The interface resistance between two of the nanofibers 12, when overlapping and contacting each other in the neural network 10, can be much higher than the resistance between an electrode 14 and a nanofiber 12. This is because the contact area between two of the nanofibers 12 is typically very small, and the contact point is between two insulating memristive shells 12B. In contrast, each electrode 14 contacts a longer length or section of the memristive shell 12B of each nanofiber 12, and the voltage drop is across only a single memristive shell 12B, rather than two memristive shells 12B between two nanofibers 12.

Figure 2:
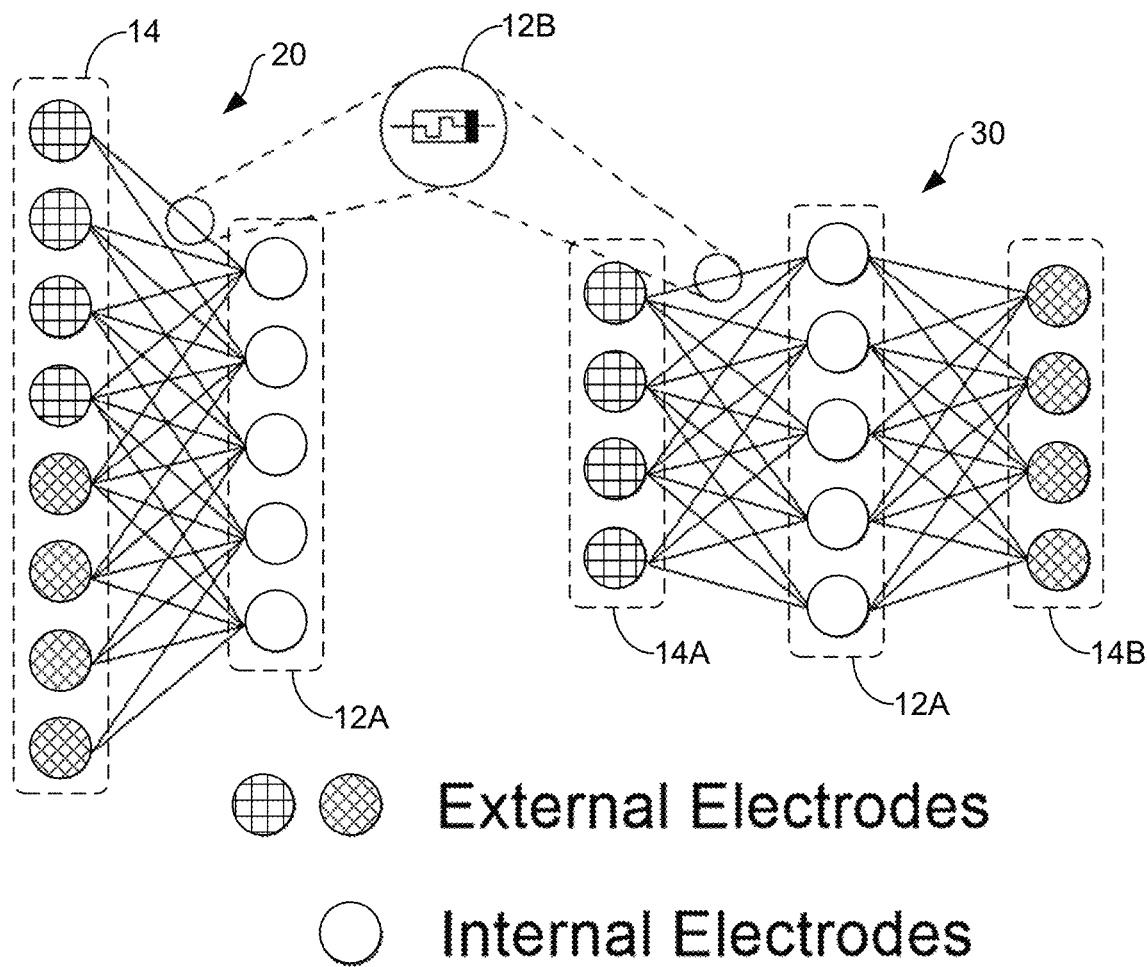
FIG. 2 illustrates an example bipartite memristive network and an alternate feedforward form of the bipartite memristive network with inputs and outputs segregated according to various embodiments described herein.

FIG. 2 illustrates an example bipartite memristive network 20 and an alternate feedforward form 30 of the bipartite memristive network 20. The electrodes 14 in FIG. 1A, which are referred to as external electrodes in FIG. 2, are connected to the conductive metallic cores 12A of the nanofibers 12 through the memristive shells 12B. The electrodes 14 are not directly connected to one another. The conductive metallic cores 12A of the nanofibers 12, which are referred to as internal electrodes, are connected to the external electrodes 14 through the memristive shells 12B.

In the alternate feedforward form 30 of the bipartite memristive network 20, the electrodes 14 are separated into a number of input electrodes 14A and output electrodes 14B. If it is assumed that the nanofibers 12 are effectively insulated or isolated from one another electrically, the feedforward form 30 of the bipartite memristive network 20 will take the form of a bipartite graph as shown.

Thus, if the external electrodes 14 are divided or segregated into the input electrodes 14A and the output electrodes 14B, the alternate feedforward form 30 of the bipartite memristive network 20 can be operated as a three-layer feedforward neural network. If more hidden layers are needed, several such networks (e.g., similar to the feedforward form 30) can be linked together. An approach to teach the alternate feedforward form 30 (also the "the feedforward network 30") of the bipartite memristive network 20 described in further detail below.

In order to determine how the feedforward network 30 behaves, Kirchoff's laws can be used to determine the voltage drops across the memristive shells 12B (or simply "memristors" as described below). Once the voltage drops and currents through the feedforward network 30 are identified, an appropriate memristor model can be applied to determine how to change the conductances of these memristors over time.

First, a procedure for changing the conductances of the output to internal node weights can be developed. If the input voltages to the feedforward network 30 are presented as voltages between $$-\frac{1}{2}V_T$$

and $$\frac{1}{2}V_T,$$

then it avoids changing any memristor conductances, since the maximum voltage drop across any memristor cannot exceed $V_T$. Next, it can be assumed that the outputs of the feedforward network 30 are read as currents at the output nodes, where the voltages are kept at ground.

Since the total current into any internal node must sum to zero (i.e., according to Kirchoff's current law), we have the following equation:

$$I_j = \sum_{i=1}^{N} G_{ij}(V_i - V_j) = 0, \qquad (1)$$

where $G_{ij}$ is the instantaneous conductance of a memristor connecting external node i to internal node j and the sum runs over all external nodes (i.e., the input and output nodes).

Equation (1) can be arranged to solve for the voltage at internal node j as shown below. Since summation is linear and $V_j$ is not indexed by i:

$$\sum_{i=1}^{N} (G_{ij}V_i - G_{ij}V_j) = 0, \qquad (2)$$

$$\sum_{i=1}^{N} G_{ij}V_i = \sum_{i=1}^{N} G_{ij}V_j, \qquad (3)$$

$$\sum_{i=1}^{N} G_{ij}V_i = V_j \sum_{i=1}^{N} G_{ij}, \text{ and} \qquad (4)$$

$$V_j = \frac{\sum_{i=1}^{N} G_{ij}V_i}{\sum_{i=1}^{N} G_{ij}} = \frac{\sum_{i=1}^{N} G_{ij}V_i}{G_j}. \qquad (5)$$

In Equation (5), the normalization factor, $G_j = \sum_{i=1}^{N} G_{ij}$, does not depend on the instantaneous values of the voltages or currents. The normalization factor $G_j$ does not significantly influence the operation of the feedforward network 30. If all of the output nodes are left at ground (i.e., $V_i=0$), the only contributions to the sum are those of the input nodes. Therefore, the voltages at the internal nodes can be considered a linear transformation of the input by a matrix of conductances divided by a normalization factor.

Similarly, the currents at the output node k can be solved for using the voltages at the internal nodes. Since the output nodes are all grounded, the current is given by:

$$I_k = \sum_{j=1}^{M} G_{kj}V_j. \qquad (6)$$

This is a linear transformation of the hidden nodes by a matrix of conductances. Since this current is accessible by an external circuit, a further non-linear transformation can take place on this sum, allowing the network to possess a non-linear output layer. For simplicity in deriving the learning algorithm, however, all layers can be assumed to be linear.

Now that an example three-layer neural network with memristive connections has been described and shown in the feedforward network 30, an appropriate algorithm is needed to train such a network. For this purpose, an approximation to the backpropagation algorithm which is suitable for training the network is described.

Figure 3:
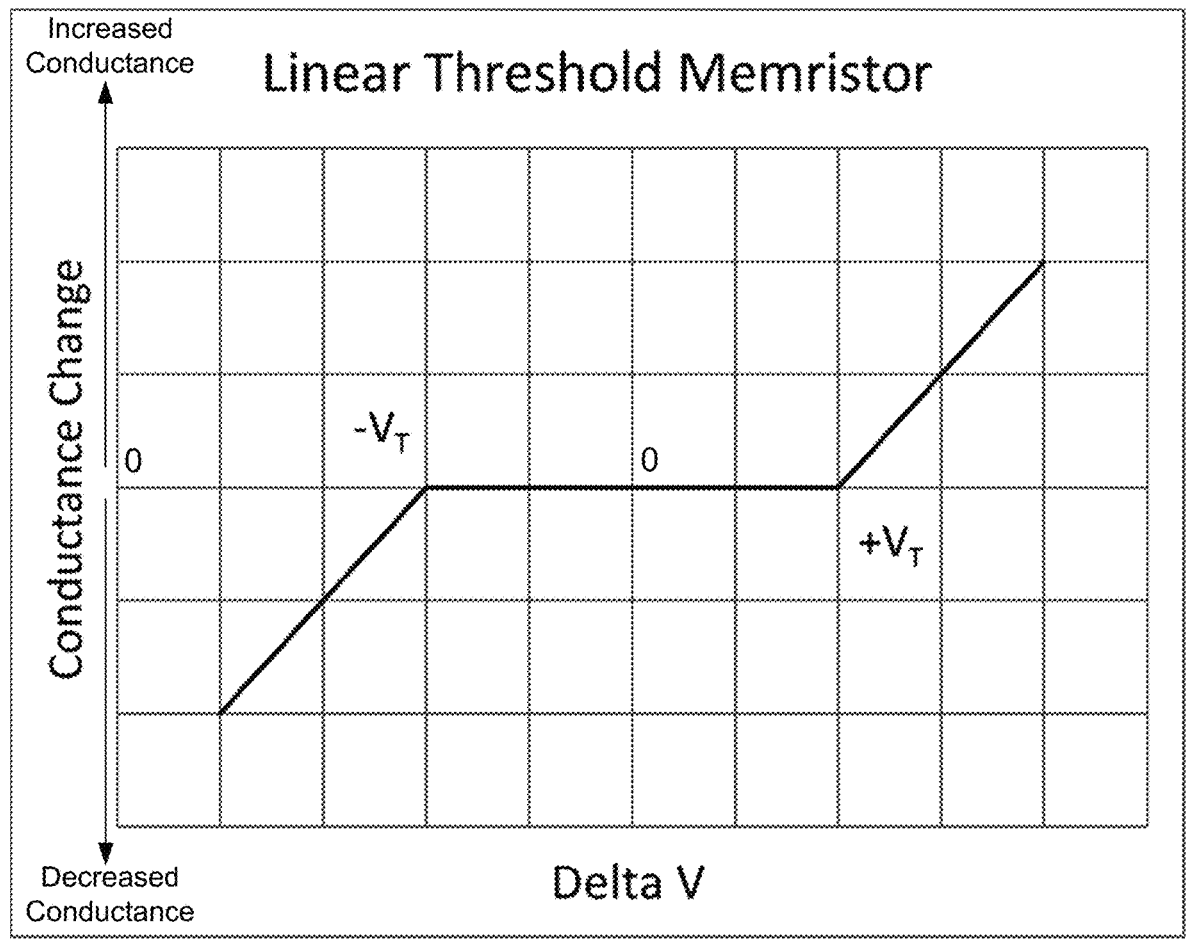
FIG. 3 illustrates an example linear model of a memristor with a threshold $V_T$ according to various embodiments described herein.

FIG. 3 illustrates an example linear model of a memristor with a threshold $V_T$ according to various embodiments described herein. To start, the weights between the internal and output nodes are considered since these weights require only the delta rule for learning. For linear neurons in this network, the delta rule is given as follows:

$$\Delta G_{kj} = \alpha(T_k - I_k)V_j, \qquad (7)$$

where $T_k$ is the desired output current, $I_k$ is the measured output current, $V_j$ is the applied voltage at internal node j, and a is the learning rate.

Intuitively, if the error delta $(T_k-I_k)$ is positive, it would be desirable to make the current $I_k$ more positive, thus decreasing the error. This can be accomplished by strengthening the connections to internal nodes which are positive, and weakening the connections to internal nodes which are negative. If the error delta is negative, the opposite should occur. The form of the delta rule is such that it is linear in both the error delta and the activation of the internal nodes. If a linear neuron with a threshold $V_T$ is assumed, the following equation is of the form of the conductance change:

$$\Delta G = \begin{cases} \alpha(\Delta V - V_T)t & \text{if } \Delta V > V_T \\ -\alpha(\Delta V + V_T)t & \text{if } \Delta V < -V_T \\ 0 & \text{if } \Delta V_T > \Delta V > -V_T \end{cases} \qquad (8)$$

In Equation (8), α is analogous to the learning rate, ΔV is the voltage drop across the memristor, and t is the duration of the applied voltage. The graph of the above equation, not including duration, is given in FIG. 3. Equation (8) is a simple model for a memristor with a threshold, so it can be used in deriving the learning algorithm. However, other memristor models, including those with noise, also work with the derived algorithm.

Since the error delta $(T_k-I_k)$ is available for measurement by an external circuit, the duration t can be set to be proportional to the magnitude of this error delta. The resulting change in conductance of the memristor $G_{kj}$ can also be made to be proportional to the voltage $V_j$ at internal node j as described below.

The voltages at the internal nodes (e.g., the conductive cores 12A) cannot be changed directly and may be unknown. However, the voltages and/or currents at the inputs and/or outputs can be directly measured. Since the outputs are all grounded initially, changing the voltage on a single output will perturb the voltages at the internal nodes. However, provided there are many inputs and outputs, this will result in only a small perturbation.

If an output node is selected and voltage set equal to $V_T$, the connections to all internal nodes with positive voltages ($+V_j$) will not change their conductances because their voltage drop ($V_T-V_j$) will be, by definition, less than $V_T$ since $V_j$ is positive. This isolates the internal nodes with negative $V_j$, whose voltage drops will be larger than $V_T$. Also, the voltage drop across each negative internal node is now equal to:

$$\Delta V = V_T - V_j, \text{such that} \quad (9)$$

$$V_j = -(\Delta V - V_T). \quad (10)$$

The quantity driving the conductance change, $\Delta G \propto (\Delta V - V_T)$, is therefore proportional to $V_j$. If the error delta is negative, the current should be more negative. Therefore, it would be desirable to strengthen the connection to the internal nodes with negative voltages. Since, in the above case, $\Delta V > V_T$, the application of $V_T$ to an output node would increase the conductances to all negative internal nodes by an amount proportional to the $V_j$ of each node. If it is assumed that this voltage is applied for a time t proportional to the error delta on this output node, the delta rule, $\Delta G_{kj} = \alpha(T_k - I_k) V_j$, can be reconstructed for this set of connections.

This can be extended to the positive internal nodes connected to this output node by applying a voltage $-V_T$ after the application of $+V_T$ for time t. Now, the voltage drop $(-V_T - V_j)$ across all internal nodes with negative voltages will be under the threshold for conductance change, effectively isolating the internal nodes with positive $V_j$. For a similar reason, the magnitude of the conductance changes across these positive internal nodes are also proportional to the voltages at each internal node in the direction to decrease, rather than increase, the conductance. Again, this is what is required for an output node with negative error delta.

To account for outputs with positive error delta, the directions of these conductance changes can be reversed. Specifically, connections to negative internal nodes can be weakened and connections to positive internal nodes can be strengthened. This can be accomplished by reversing the voltage polarities of all inputs (thus flipping the signs of all internal nodes), followed by the same procedure described above. This will flip the direction of the voltage drop across each memristor in each case.

Next, a procedure for changing the conductances of the input to internal node weights can be developed. Since the input voltages are restricted to between $$-\frac{1}{2}V_T$$

and $$\frac{1}{2}V_T,$$

these weights could not have changed during the training of the output weights, as the maximum voltage drop from input node to internal node cannot exceed $V_T$.

The backpropagation step of the backpropagation algorithm is given by the following equation:

$$\Delta G_{ij} = \alpha(\Sigma_k G_{kj}(T_k - I_k))V_i. \quad (11)$$

Instead of the center term being proportional to the error delta, it is now equal to a weighted sum of error deltas. This is the internal node j's "contribution to the error". The term on the right is the voltage at the input, which is accessible for measurement. The duration t can be made proportional to the absolute value of this input $V_i$.

Now, the above weighted sum can be reproduced as a voltage on internal node j, and the same methods described above can be applied to change the conductances proportionally to this voltage.

If the error deltas $(T_k - I_k)$ are taken and converted into voltages, this weighted sum can be achieved by placing these voltages on the output nodes while grounding the input nodes. The resulting contribution to the error on each internal node is accurate up to a normalization factor $G_j$, which again does not significantly influence the learning process.

By applying a voltage $V_T$ to an input node with a positive input, it is possible to selectively strengthen the conductances to all nodes connected to it with a negative voltage, decreasing these internal nodes' contributions to the error. Similarly, applying a voltage $-V_T$ will selectively weaken the conductances to all nodes with positive voltage, again reducing these nodes' contributions to the error. Flipping the signs of all the error deltas, input nodes with negative input can be handled in the same way.

Figure 4:
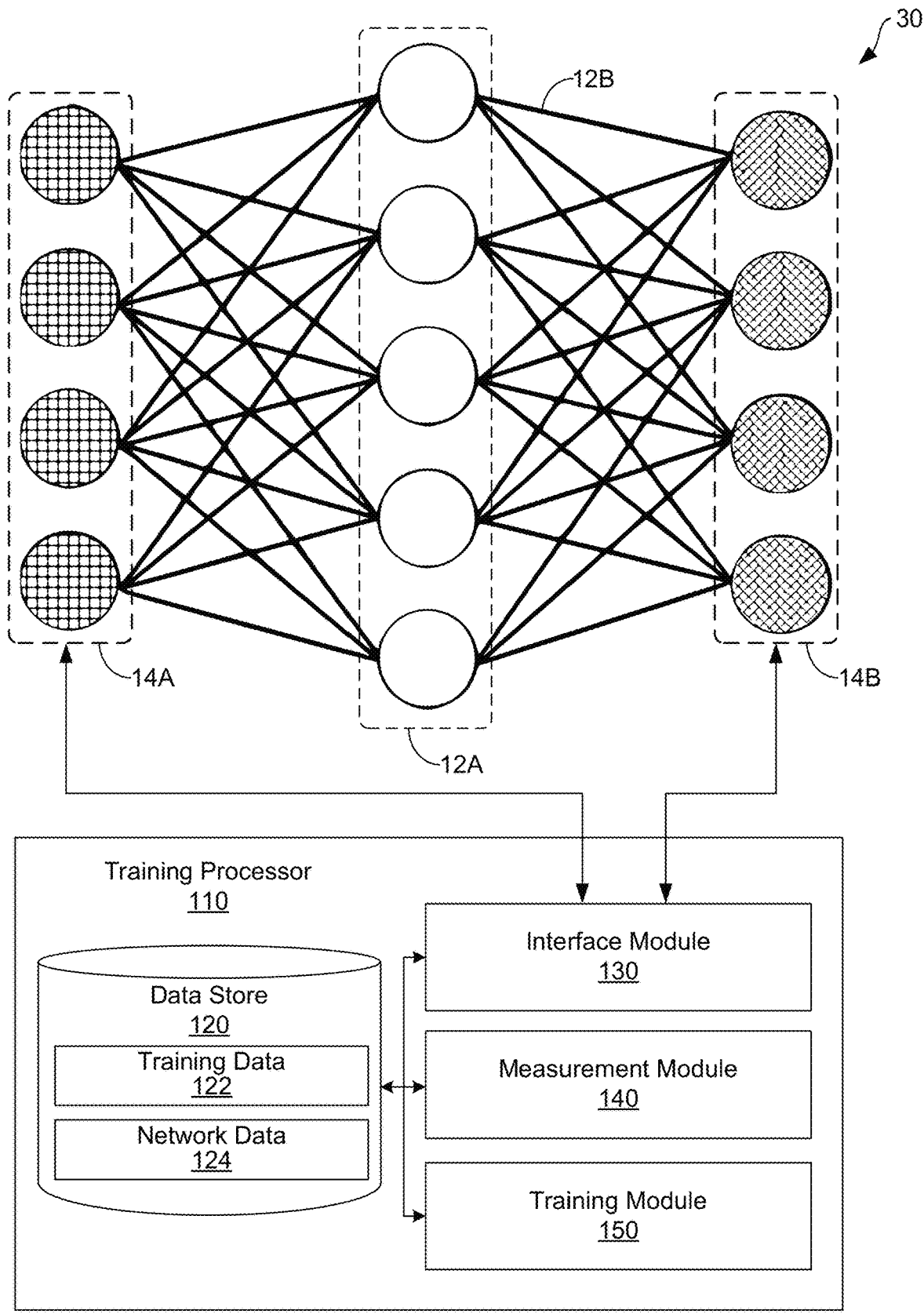
FIG. 4 illustrates an example training processor for training the feedforward network shown in FIG. 2 according to various embodiments described herein.

FIG. 4 illustrates an example training processor 110 for training the feedforward network 30 shown in FIG. 2 according to various embodiments described herein. The training processor 110 includes a data store 120, an interface module 130, a measurement module 140, and a training module 150. The data store 120 stores various types of data, including the training data 122 and the network data 124. The training data 122 can be relied upon by the training module 150 to train the feedforward network 30. For example, the training data 122 can include data that defines the target weights between the internal nodes (e.g., the conductive metallic cores 12A) in the feedforward network 30 and the output nodes (e.g., the input electrodes 14A and/or the output electrodes 14B). Thus, the training data 122 can define the target levels or values of conductance to be programmed into each of the memristive shells 12B in the feedforward network 30. The training data 122 can be based on any suitable model for training, for any purpose of training a network.

The network data 124 can include data that defines the network structure of the feedforward network 30, such as the connections between the conductive metallic cores 12A, the input electrodes 14A, and the output electrodes 14B. Thus, the network data 124 can define the memristor connections formed by the memristive shells 12B between the conductive metallic cores 12A, the input electrodes 14A, and the output electrodes 14B shown in FIG. 4. The training module 150 can reference the network data 124 to determine the appropriate sequence of steps to use for training the feedforward network 30.

The interface module 130 can include one or more circuits to provide an electrical interface with the input electrodes 14A and the output electrodes 14B. For example, the interface module 130 can include circuitry capable of providing input voltages and/or currents to one or more of the input electrodes 14A and/or the output electrodes 14B. The interface module 130 can include circuitry capable of grounding one or more of the input electrodes 14A and/or the output electrodes 14B. The interface module 130 can also include circuitry capable of reading voltages and/or currents at one or more of the input electrodes 14A and/or the output electrodes 14B.

The measurement module 140 can include one or more circuits to take measurements at one or more of the input electrodes 14A and/or the output electrodes 14B. For example, the measurement module 140 can measure voltages and/or currents at one or more of the input electrodes 14A and/or the output electrodes 14B. The measurement module 140 can also calculate the difference between various voltages, currents, etc., to determine the differences between measured and target values. Both the interface module 130 and the measurement module 140 can be embodied as any suitable network of analog and/or digital circuitry, including amplifiers, filters, and processing circuitry, with memory.

Figure 5A:
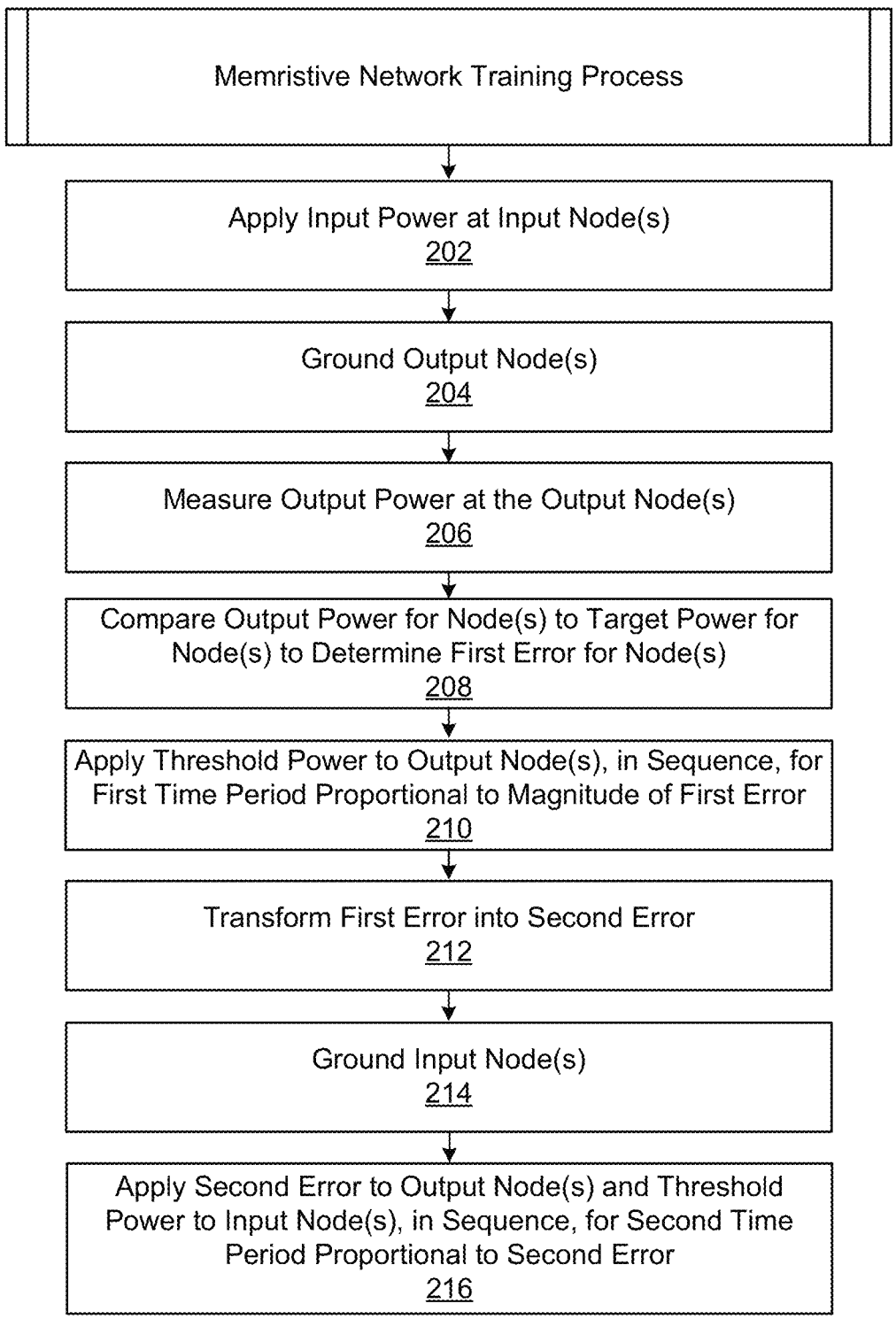
FIG. 5A illustrates an example memristive network training process according to various embodiments described herein.
Figure 5B:
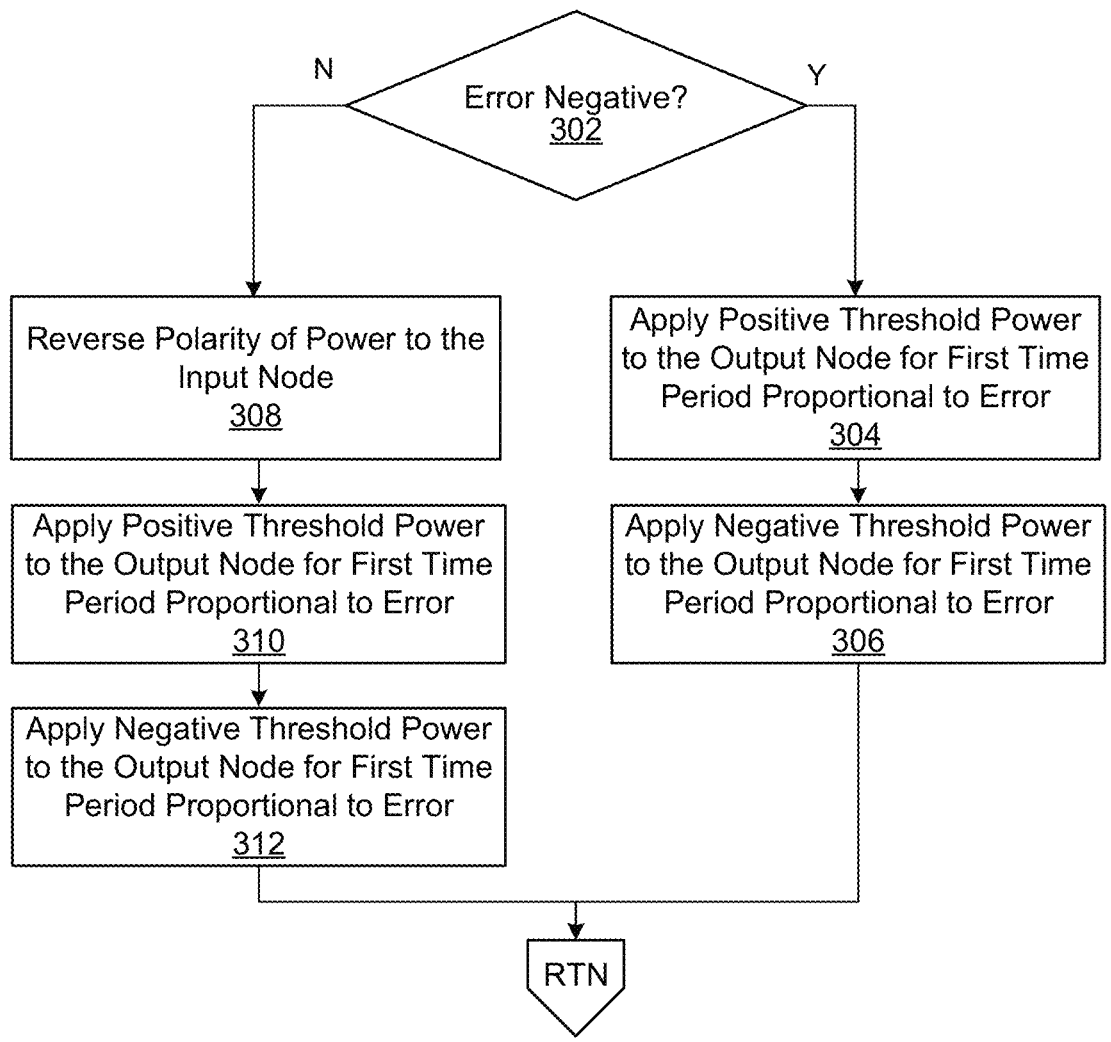
FIG. 5B further illustrates the example memristive network training process shown in FIG. 5A according to various embodiments described herein.
Figure 5C:
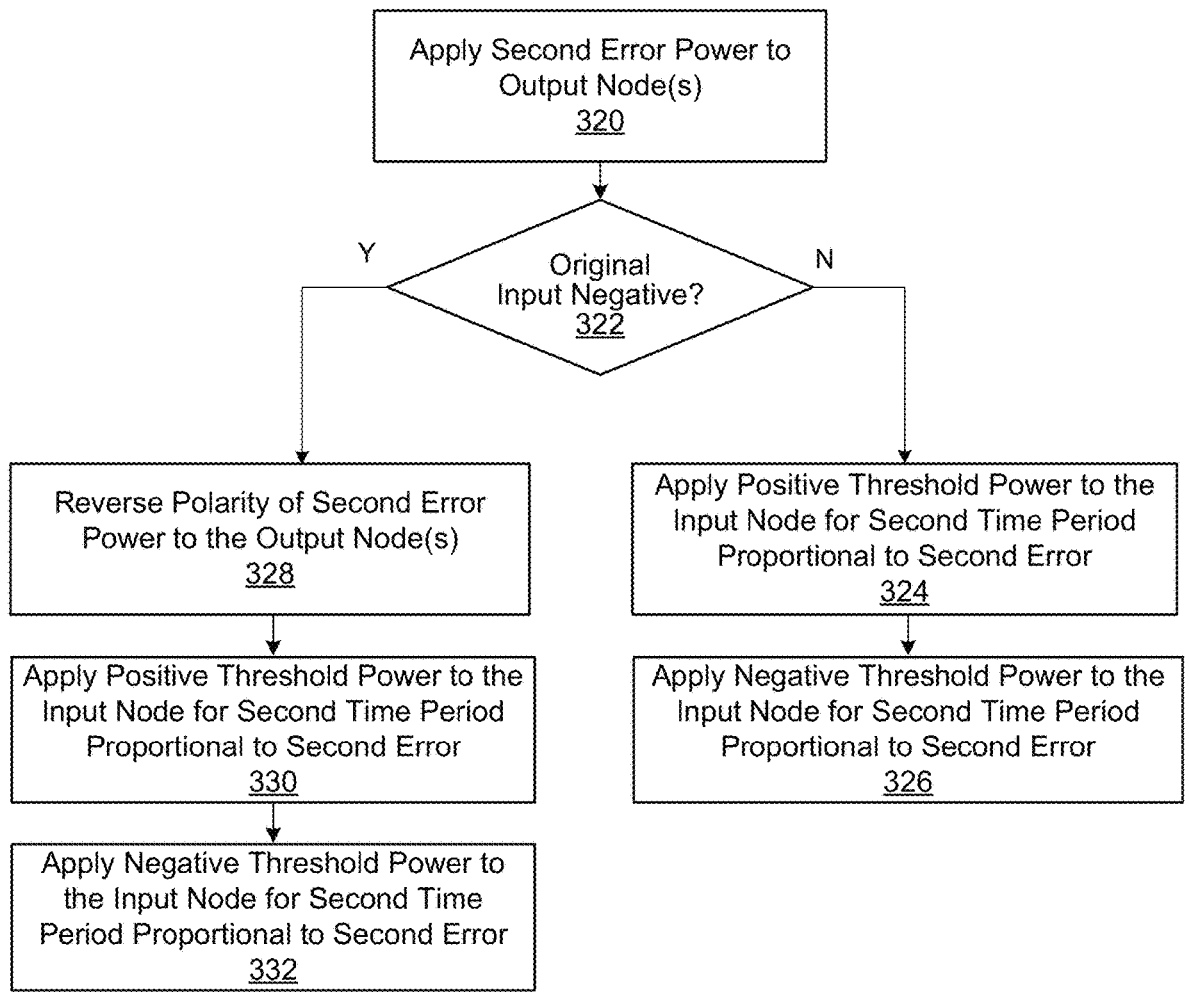
FIG. 5C further illustrates the example memristive network training process shown in FIG. 5A according to various embodiments described herein.

The training module 150 can be embodied as processing circuitry capable of conducting the memristive network training process shown in FIGS. 5A, 5B, and 5C. In that context, the training module 150 can direct the interface module 130 to train the conductances or weights between the input electrodes 14A and the conductive cores 12A of the internal nodes. The training module 150 can also direct the interface module 130 to train the conductances or weights between the conductive cores 12A of the internal nodes and the output electrodes 14B.

In the practical sense, the internal structure of the feedforward network 30 (e.g., the individual connections and/or conductances of the memristive shell 12B connections between the input electrodes 14A, the output electrodes 14B, and the conductive cores 12A) may be unknown. Thus, the algorithm performed by the training module 150 is designed to perform the training process implicitly. Through training the feedforward network 30, the training module 150 is effectively self-organizing a set of pathways between the input electrodes 14A and the conductive cores 12A, and between the output electrodes 14B and the conductive cores 12A. The pathways are defined or organized through adjusting the conductances of the memristive shells 12B between the input electrodes 14A, the output electrodes 14B, and the conductive cores 12A. In some cases, rather than using a set of target weights for training, the training module 150 can start with a set of target currents at the output electrodes 14B.

FIGS. 5A-5C illustrate an example memristive network training process for training a feedforward network according to various embodiments described herein. The training process is described in connection with the feedforward network 30 and the training processor 110 shown in FIG. 4. Thus, the training processor 110 is configured to perform the process shown in FIGS. 5A-5C. However, other feedforward networks can be trained by other training processors using the process shown in FIGS. 5A-5C. Further, although the process diagrams show an order of operation or execution, the order can differ from that which is shown. For example, the order of execution of two or more process steps can be switched relative to the order shown or as described below. Also, two or more process steps shown in succession can be executed concurrently or with partial concurrence. Further, in some examples, one or more of the process steps shown in the process diagrams can be skipped or omitted.

Turning to FIG. 5A, the training module 150 can first train the conductances or weights (e.g., the conductances of the memristors) the between the conductive cores 12A of the internal nodes and the output electrodes 14B in the feedforward network 30. To that end, at step 202, the process includes applying input power to one or more input nodes of a feedforward network. For example, the training module 150 can direct the interface module 130 to apply a voltage between $$-\frac{1}{2}V_T$$

and $$\frac{1}{2}V_T$$

to one or more of the input electrodes 14A of the feedforward network 30. In some cases, the training module 150 can direct the interface module 130 to apply a voltage between $$-\frac{1}{2}V_T$$

and $$\frac{1}{2}V_T$$

to each of the input electrodes 14A. As an alternative to the application of voltages, the training module 150 can direct the interface module 130 to apply or drive a certain level of current to one or more of the input electrodes 14A.

At step 204, the process can include grounding one or more output nodes of the feedforward network. For example, the training module 150 can direct the interface module 130 to ground one or more of the output electrodes 14B of the feedforward network 30. In some cases, the training module 150 can direct the interface module 130 to ground each of the output electrodes 14B.

As noted above, in Equation (5), the normalization factor, $$G_j = \sum_{i=1}^{N} G_{ij},$$

does not depend on the instantaneous values of the voltages or currents. The normalization factor $G_j$ does not significantly influence the operation of the feedforward network 30. If all of the output nodes are left at ground (i.e., $V_j=0$), the only contributions to the sum are those of the input nodes. Therefore, the voltages at the internal nodes can be considered a linear transformation of the input by a matrix of conductances divided by a normalization factor.

Similarly, the currents at the output electrodes 14B can be solved for by the training module 150. Since the output electrodes 14B are all grounded at step 204, the current can be given by Equation (6). As noted above, this is a linear transformation of the hidden nodes by a matrix of conductances. At the same time, the actual currents at the output electrodes 14B are accessible by the interface module 130 for measurement by the measurement module 140.

At step 206, the process can include the measurement module 140 measuring an output current at one or more of the output electrodes 14B. The measurement module 140 can measure an output current each of the output electrodes 14B, in turn, and store those values in the data store 120 for further processing. In addition to current, the measurement module 140 can also measure output voltages at one or more of the output electrodes 14B at step 106 in some cases.

At step 208, the process can include the training module 150 comparing the output current (or voltage) at the one or more of the output electrodes 14B, as measured at step 206, with a target or desired output current (or voltage) to determine a first error delta. Step 208 can be performed, in sequence, for each of the output electrodes 14B, and a first error delta can be determined for each of the output electrodes 14B. The error deltas can be stored in the data store 120 for further processing.

Step 208 follows from the application of the delta rule according to Equation (7) above. If the error delta (e.g., $(T_k-I_k)$ in Equation (7)) is positive, it would be desirable to make the current or currents measured at step 206 greater, thus decreasing the error. This can be accomplished by strengthening the connections to internal nodes which are positive, and weakening the connections to internal nodes which are negative. If the error delta is negative, it would be desirable to make the current or currents measured at step 206 smaller to decrease the error.

At step 210, the process can include the training module 150 applying a threshold voltage or current to one or more of the output electrodes 14B for a time period proportional to a magnitude of the first error delta determined at step 208. For example, a first error delta can be determined at step 208 for a first one of the output electrodes 14B. Then, at step 210, the training module 150 can direct the interface module 130 to apply a positive threshold voltage $V_T$ or a negative threshold voltage $-V_T$ to the first one of the output electrodes 14B for a time period proportional to a magnitude of the first error delta determined for the first one of the output electrodes 14B at step 208. The remaining output electrodes 14B (i.e., other than the first) can remain grounded. Step 210 can iterate over each of the of the output electrodes 14B, in turn.

The procedure of applying a threshold voltage at step 210 is shown in greater detail in FIG. 5B. At step 302 in FIG. 5B, the process includes the training module 150 determining whether the error delta (e.g., $(T_k-I_k)$ in Equation (7)) from step 208 for the first one of the output electrodes 14B is negative. If the error delta is negative, then the process proceeds to step 304. If the error delta is positive, then the process proceeds to step 308.

At step 304, the process includes the training module 150 applying a positive threshold voltage or current to one or more of the output nodes for the time period proportional to the error delta. For example, an error delta can be determined at step 208 for a first one of the output electrodes 14B. Then, at step 304, the training module 150 can direct the interface module 130 to apply a positive threshold voltage $V_T$ to the first one of the output electrodes 14B for a time period proportional to the magnitude of the error delta determined at step 208. The remaining output electrodes 14B (i.e., other than the first) can remain grounded at step 304.

As noted above, if a first one of the output electrodes 14B is selected and voltage set equal to $V_T$ at step 304, then the connections to all internal nodes with positive voltages $(+V_j)$ will not change their conductances because their voltage drop $(V_T-V_j)$ will be, by definition, less than $V_T$ since $V_j$ is positive. This isolates the internal nodes with negative $V_j$, whose voltage drops will be larger than $V_T$. Also, the voltage drop across each negative internal node is now equal to the relationships in Equations (9) and (10).

Further, the quantity driving the conductance change, $\Delta G \propto (\Delta V-V_T)$, is therefore proportional to $V_j$. If the error delta is negative (i.e., the "Yes" branch from step 302 in FIG. 5B), the current should be more negative. Therefore, it would be desirable to strengthen the connection to the internal nodes with negative voltages. Since, in the above case, $\Delta V > V_T$, the application of $V_T$ at step 304 to the first one of the output electrodes 14B can increase the conductances to all negative internal nodes by an amount proportional to the $V_j$ of each node. If it is assumed that this voltage is applied for a time t proportional to the error delta on this output node, then the backpropagation algorithm, $\Delta G_{kj}=\alpha(T_k-I_k)V_j$, can be reconstructed for this set of connections.

This can be extended to the positive internal nodes connected to the first one of the output electrodes 14B by applying a voltage $-V_T$ after the application of $+V_T$ for the time t. Thus, at step 306, the process can also include applying a negative threshold voltage or current to one or more of the output nodes for the time period proportional to the error delta. For example, at step 306, the training module 150 can direct the interface module 130 to apply a negative threshold voltage $-V_T$ to the first one of the output electrodes 14B for a time period t proportional to the magnitude of the error delta determined at step 208. The remaining output electrodes 14B (i.e., other than the first) can remain grounded at step 306.

Due to step 306, the voltage drop $(-V_T-V_j)$ across all internal nodes with negative voltages will be under the threshold for conductance change, effectively isolating the internal nodes with positive $V_j$. For a similar reason, the magnitude of the conductance changes across these positive internal nodes are also proportional to the voltages at each internal node in the direction to decrease, rather than increase, the conductance. Again, this is what is required for an output node with negative error delta (i.e., the "Yes" branch from step 302 in FIG. 5B). Steps 304 and 306 can occur for all output electrodes 14B with a negative error deltas.

To account for outputs with positive error deltas (i.e., the "No" branch from step 302 in FIG. 5B), the directions of these conductance changes can be reversed. Specifically, connections to negative internal nodes can be weakened and connections to positive internal nodes can be strengthened. This can be accomplished by reversing the voltage polarities of all inputs (thus flipping the signs of all internal nodes) at step 308. At step 308, the process includes the training module 150 reversing a polarity of the input voltage or current applied to the input electrodes 14A. This can be a reversal of the polarity of the voltage or current applied to the input electrodes 14A at step 202. Further, at steps 310 and 312, the process includes steps similar to steps 304 and 306, respectively. Steps 308, 310, and 312 can occur for all output electrodes 14B with a positive error delta. The process can return from FIG. 5B to step 212 in FIG. 5A.

Turning back to FIG. 5A, the training module 150 can now train the conductances or weights between the input electrodes 14A and the conductive cores 12A of the internal nodes. Since the voltages applied to input electrodes 14A were restricted to between $$-\frac{1}{2}V_T$$

and $$\frac{1}{2}V_T$$

among steps 202, 204, 206, 208, and 210, the and weights between the input electrodes 14A and the conductive cores 12A of the internal nodes could not have changed during the training of the output weights, as the maximum voltage drop from input node to internal node cannot exceed $V_T$.

At step 212, the process can include the training module 150 transforming, for one or more of the output electrodes 14B, the first error deltas of the output electrodes 14B determined at step 208, into second error deltas for the output electrodes 14B. As one example, the training module 150 can transform the first error delta current (e.g., $(T_k-I_k)$ in Equation (7)) for the first one the output electrodes 14B into a second error delta, which may be a voltage. The second error delta can be proportionate to the first error delta, but converted from a current to a voltage, for example, or from a voltage to a current. Step 212 can be performed for each of the output electrodes 14B with reference to the first error deltas from step 208 which were stored in the data store 120.

At step 214, the process can include grounding one or more input nodes of the feedforward network. For example, the training module 150 can direct the interface module 130 to ground one or more of the input electrodes 14A of the feedforward network 30. In some cases, the training module 150 can direct the interface module 130 to ground each of the input electrodes 14A.

At step 216, the process can include, for each of the output electrodes 14B, applying the second error delta determined at step 212 to the output electrode 14B. For example, a second error delta, which can be a voltage, can be determined at step 212 for each of the output electrodes 14B as described above. The training module 150 can direct the interface module 130 to apply the second error delta voltages for each of the output electrodes 14B, respectively, to the output electrodes 14B. Step 216 can also include applying threshold voltages or currents to the input electrodes 14A, in turn, for a second time period proportional to an absolute value of the second error delta.

The procedure of step 216 is shown in greater detail in FIG. 5C. At step 320 in FIG. 5C, the training module 150 can direct the interface module 130 to apply the second error delta voltages determined at step 212 for each of the output electrodes 14B, respectively, to the output electrodes 14B.

At step 322 in FIG. 5C, the process includes the training module 150 determining whether original input applied to one of the input electrodes 14A at step 202 in FIG. 5A, was negative. If the original input was negative, then the process proceeds to step 324. If the original input was positive, then the process proceeds to step 328.

At step 324, the process includes the training module 150 applying a positive threshold voltage or current to one or more of the input nodes for the time period proportional to the second error delta. For example, the training module 150 can direct the interface module 130 to apply a positive threshold voltage $V_T$ to one of the input electrodes 14A for a second time period proportional to an absolute value of the second error delta determined at step 212 in FIG. 5A. Further, at step 326, the training module 150 can direct the interface module 130 to apply a negative threshold voltage- $V_T$ to the first one of the input electrodes 14A for the second time period. The remaining input electrodes 14A (i.e., other than the first) can remain grounded at steps 324 and 326.

At step 328 in FIG. 5C, the process includes the training module 150 reversing a polarity of the second error delta voltages applied to the output electrodes 14B at step 320. At step 3330, the process includes the training module 150 applying a positive threshold voltage or current to one or more of the input nodes for the time period proportional to the second error delta. For example, the training module 150 can direct the interface module 130 to apply a positive threshold voltage $V_T$ to one of the input electrodes 14A for a second time period proportional to an absolute value of the second error delta determined at step 212 in FIG. 5A. Further, at step 332, the training module 150 can direct the interface module 130 to apply a negative threshold voltage- $V_T$ to the first one of the input electrodes 14A for the second time period. The remaining input electrodes 14A (i.e., other than the first) can remain grounded at steps 324 and 326.

The algorithm presented in FIGS. 5A-5C reproduces the backpropagation algorithm in bipartite memristive networks. Although presented in one example order or sequence in FIGS. 5A-5C, the algorithm can, in some cases, be applied or used in alternative sequences. Additionally, while certain voltages and currents are described as being applied and/or measured in the algorithm, it should be appreciated that the measurement or application of a voltage can be substituted by that of a current. Similarly, the measurement or application of a current can be substituted by that of a voltage. Since the algorithm only iterates over each external node once per training example, it is first order in time with respect to the number of nodes. This is in contrast with the standard implementation of the backpropagation algorithm, which is second order in time.

The components described herein, including the interface module 130, the measurement module 140, and the training module 150, can be embodied in hardware, software, or a combination of hardware and software. If embodied in software, each element can represent a module or group of code that includes program instructions to implement the specified logical function(s). The program instructions can be embodied in the form of, for example, source code that includes human-readable statements written in a programming language or machine code that includes machine instructions recognizable by a suitable execution system, such as a processor in a computer system or other system. If embodied in hardware, each element can represent a circuit or a number of interconnected circuits that implement the specified logical function(s).

The training processor 110 can include at least one processing circuit. Such a processing circuit can include, for example, one or more processors and one or more storage or memory devices coupled to a local interface. The local interface can include, for example, a data bus with an accompanying address/control bus or any other suitable bus structure. The storage or memory devices can store data or components that are executable by the processors of the processing circuit. For example, the training module 150 and/or other components can be stored in one or more storage devices and be executable by one or more processors in the training processor 110.

The training module 150 and other components described herein can be embodied in the form of hardware, as software components that are executable by hardware, or as a combination of software and hardware. If embodied as hardware, the components described herein can be implemented as a circuit or state machine that employs any suitable hardware technology. The hardware technology can include, for example, one or more microprocessors, discrete logic circuits having logic gates for implementing various logic functions upon an application of one or more data signals, application specific integrated circuits (ASICs) having appropriate logic gates, programmable logic devices (e.g., field-programmable gate array (FPGAs), and complex programmable logic devices (CPLDs)).

Also, one or more or more of the components described herein that include software or program instructions can be embodied in any non-transitory computer-readable medium for use by or in connection with an instruction execution system such as, a processor in a computer system or other system. The computer-readable medium can contain, store, and/or maintain the software or program instructions for use by or in connection with the instruction execution system.

A computer-readable medium can include a physical media, such as, magnetic, optical, semiconductor, and/or other suitable media. Examples of a suitable computer-readable media include, but are not limited to, solid-state drives, magnetic drives, or flash memory. Further, any logic or component described herein can be implemented and structured in a variety of ways. For example, one or more components described can be implemented as modules or components of a single application. Further, one or more components described herein can be executed in one computing device or by using multiple computing devices.

The above-described examples of the present disclosure are merely possible examples of implementations set forth for a clear understanding of the principles of the disclosure. Many variations and modifications can be made without departing substantially from the spirit and principles of the disclosure. All such modifications and variations are intended to be included herein within the scope of this disclosure and protected by the following claims.

Therefore, the following is claimed:

1. A method to train a memristive network comprising a number of input nodes and a number of output nodes, comprising:
    applying an input voltage or current to an input node among the number of input nodes;
    grounding an output node among the number of output nodes;
    measuring an output current or voltage at the grounded output node;
    determining an error delta from the measured output current or voltage and a target current or voltage, where the error delta equals the target current or voltage minus the measured output current or voltage;
    applying a threshold voltage or current to the output node after ungrounding the output node, the threshold voltage or current applied for a time period proportional to a magnitude of the error delta;
    transforming the error delta into a second error delta;
    grounding an input node among the number of input nodes; and
    applying the threshold voltage or current to the input node after ungrounding the grounded input node, the threshold voltage or current applied for a second time period proportional to the second error delta.

2. The method of claim 1, wherein, when the error delta is negative, applying the threshold voltage or current to the output node comprises:
    applying a positive threshold voltage or current to the output node for the time period proportional to the error delta; and
    applying a negative threshold voltage or current to the output node for the time period proportional to the error delta.

3. The method of claim 1, wherein, when the error delta is positive, applying the threshold voltage or current to the output node comprises:
    reversing a polarity of the input voltage or current applied to the input node;
    applying a positive threshold voltage or current to the output node for the time period proportional to the error delta; and
    applying a negative threshold voltage or current to the output node for the time period proportional to the error delta.

4. The method of claim 1, wherein:
    the second error delta comprises an error delta voltage or current; and
    the method further comprises:
        applying the error delta voltage or current to the output node with the grounded input node grounded; and
        applying the threshold voltage or current to the input node for the second time period after ungrounding the grounded input node, the second time period being proportional to an absolute value of the error delta voltage or current.

5. The method of claim 4, wherein, when the input voltage or current applied to the input node was positive, applying the threshold voltage or current to the input node for the second time period after ungrounding the grounded input node comprises:
    applying a positive threshold voltage or current to the input node for the second time period proportional to the absolute value of the error delta voltage or current; and
    applying a negative threshold voltage or current to the input node for the second time period proportional to the absolute value of the error delta voltage or current.

6. The method of claim 4, wherein, when the input voltage or current applied to the input node was negative, applying the threshold voltage or current to the input node for the second time period after ungrounding the grounded input node comprises:
    reversing a polarity of the error delta voltage or current applied to the output node;
    applying a positive threshold voltage or current to the input node for the second time period proportional to the absolute value of the error delta voltage or current; and
    applying a negative threshold voltage or current to the input node for the second time period proportional to the absolute value of the error delta voltage.

7. The method of claim 1, wherein the memristive network further comprises:
    a memristive network of memristive nanofibers; and
    internal electrodes electrically coupled between the number of input nodes and the number of output nodes by memristive shells of the memristive nanofibers.

8. The method of claim 1, wherein the method reproduces a backpropagation algorithm for training the memristive network of permissive nanofibers.

9. A memristive network, comprising:
    a number of nanofibers, wherein each nanofiber comprises a metallic core and a memristive shell;
    a number of electrodes deposited upon the nanofibers, wherein the number of electrodes comprise a number of input nodes and a number of output nodes; and
    a training processor configured to:
        apply an input voltage or current to an input node among the number of input nodes;
        ground an output node among the number of output nodes;
        measure an output current or voltage at the grounded output node;
        determine an error delta from the measured output current or voltage and a target current or voltage, where the error delta equals the target current or voltage minus the measured output current or voltage;
        apply a threshold voltage or current to the output node after ungrounding the grounded output node, the threshold voltage or current applied for a time period proportional to a magnitude of the error delta;

transform the error delta into a second error delta;

ground an input node among the number of input nodes; and apply the threshold voltage or current to the input node after ungrounding the grounded input node, the threshold voltage or current applied for a second time period proportional to the second error delta.

10. The memristive network according to claim 9, wherein, when the error delta is negative, the training processor is further configured to:

apply a positive threshold voltage or current to the output node for the time period proportional to the error delta; and apply a negative threshold voltage or current to the output node for the time period proportional to the error delta.

11. The memristive network according to claim 9, wherein, when the error delta is positive, the training processor is further configured to:

reverse a polarity of the input voltage or current applied to the input node;

apply a positive threshold voltage or current to the output node for the time period proportional to the error delta; and apply a negative threshold voltage or current to the output node for the time period proportional to the error delta.

12. The memristive network according to claim 9, wherein:

the second error delta comprises an error delta voltage or current; and the training processor is further configured to:

apply the error delta voltage or current to the output node with the grounded input node grounded; and apply the threshold voltage or current to the input node for the second time period after ungrounding the grounded input node, the second time period being proportional to an absolute value of the error delta voltage or current.

13. The memristive network according to claim 12, wherein, when the input voltage or current applied to the input node was positive, the training processor is further configured to:

apply a positive threshold voltage or current to the input node for the second time period proportional to the absolute value of the error delta voltage or current; and apply a negative threshold voltage or current to the input node for the second time period proportional to the absolute value of the error delta voltage or current.

14. The memristive network according to claim 12, wherein, when the input voltage or current applied to the input node was negative, the training processor is further configured to:

reverse a polarity of the error delta voltage or current applied to the output node;

apply a positive threshold voltage or current to the input node for the second time period proportional to the absolute value of the error delta voltage or current; and apply a negative threshold voltage or current to the input node for the second time period proportional to the absolute value of the error delta voltage.

15. The memristive network according to claim 9, wherein the memristive network further comprises:

a memristive network of memristive nanofibers; and internal electrodes electrically coupled between the number of input nodes and the number of output nodes by memristive shells of the memristive nanofibers.

16. A method to train a memristive network comprising a number of input nodes and a number of output nodes, comprising:

applying an input voltage to an input node among the number of input nodes;

grounding an output node among the number of output nodes;

measuring an output current at the grounded output node;

determining an error delta from the measured output current and a target current to determine an error delta, where the error delta equals the target current or voltage minus the measured output current or voltage;

applying a threshold voltage to the output node after ungrounding the grounded output node, the threshold voltage or current applied for a time period proportional to a magnitude of the error delta;

transforming the error delta into a second error delta;

grounding an input node among the number of input nodes; and applying the threshold voltage to the input node after ungrounding the grounded input node, the threshold voltage or current applied for a second time period proportional to the second error delta.

17. The method of claim 16, wherein, when the error delta is negative, applying the threshold voltage to the output node after ungrounding the grounded output node comprises:

applying a positive threshold voltage to the output node for the time period proportional to the error delta; and applying a negative threshold voltage to the output node for the time period proportional to the error delta.

18. The method of claim 16, wherein, when the error delta is positive, applying the threshold voltage to the output node after ungrounding the grounded output node comprises:

reversing a polarity of the input voltage applied to the input node;

applying a positive threshold voltage to the output node for the time period proportional to the error delta; and applying a negative threshold voltage to the output node for the time period proportional to the error delta.

19. The method of claim 16, wherein the memristive network further comprises:

a memristive network of memristive nanofibers; and internal electrodes electrically coupled between the number of input nodes and the number of output nodes by memristive shells of the memristive nanofibers.

20. The method of claim 19, wherein the method reproduces a backpropagation algorithm for training the memristive network of memristive nanofibers.

* * * * *